(12) United States Patent
Jain et al.

(10) Patent No.: US 11,037,651 B2
(45) Date of Patent: Jun. 15, 2021

(54) DUAL TAP ARCHITECTURE FOR ENABLING SECURE ACCESS FOR DDR MEMORY TEST CONTROLLER

(71) Applicant: QUALCOMM Incorporated, San Diego, CA (US)

(72) Inventors: Arvind Jain, San Diego, CA (US); Anju George, Ernakulam (IN); Swayam Pattnaik, Bhubaneswar (IN)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/675,676

(22) Filed: Nov. 6, 2019

(65) Prior Publication Data

US 2020/0143902 A1    May 7, 2020

Related U.S. Application Data

(60) Provisional application No. 62/757,021, filed on Nov. 7, 2018.

(51) Int. Cl.
| | | |
|---|---|---|
| *G11C 29/00* | (2006.01) | |
| *G11C 29/56* | (2006.01) | |
| *G11C 29/48* | (2006.01) | |
| *G11C 29/14* | (2006.01) | |
| *G11C 29/32* | (2006.01) | |

(52) U.S. Cl.
CPC .............. *G11C 29/56* (2013.01); *G11C 29/14* (2013.01); *G11C 29/32* (2013.01); *G11C 29/48* (2013.01); *G11C 2029/5602* (2013.01)

(58) Field of Classification Search
CPC ......... G11C 29/56; G11C 29/14; G11C 29/32; G11C 29/48; G11C 2029/5602
USPC ........................................................ 365/201
See application file for complete search history.

(56) References Cited

U.S. PATENT DOCUMENTS

| | | | | |
|---|---|---|---|---|
| 8,601,204 | B2 * | 12/2013 | Rajan .................. | G06F 13/4243 711/103 |
| 10,642,538 | B1 * | 5/2020 | MacLaren ............. | G06F 3/0604 |
| 2003/0076125 | A1 * | 4/2003 | McCord .......... | G01R 31/318505 324/754.07 |
| 2004/0246781 | A1 * | 12/2004 | Liu ...................... | G11C 29/027 365/185.33 |
| 2008/0104464 | A1 * | 5/2008 | Elliott ............ | G01R 31/318555 714/726 |

* cited by examiner

*Primary Examiner* — Huan Hoang
(74) *Attorney, Agent, or Firm* — Qualcomm Incorporated

(57) ABSTRACT

Disclosed are methods and apparatus for securely accessing and testing a double data rate (DDR) memory device. The apparatus includes a first memory test access port (TAP) configured to enable or disable access to at least one double date rate (DDR) memory device, a second memory TAP configured to enable or disable access to at least one non-DDR memory device, and a test controller configured to test the at least one DDR memory device via the first memory TAP or test the at least one non-DDR memory device via the second memory TAP. In an aspect, at least one non-DDR memory device contains proprietary information. Accordingly, access to the at least one non-DDR memory device via the second memory TAP is disabled when access to the at least one DDR memory device via the first memory TAP is enabled.

24 Claims, 14 Drawing Sheets

Input of first insertion 1302

Input of second insertion 1306

Output of first insertion 1304

Output of second insertion 1308

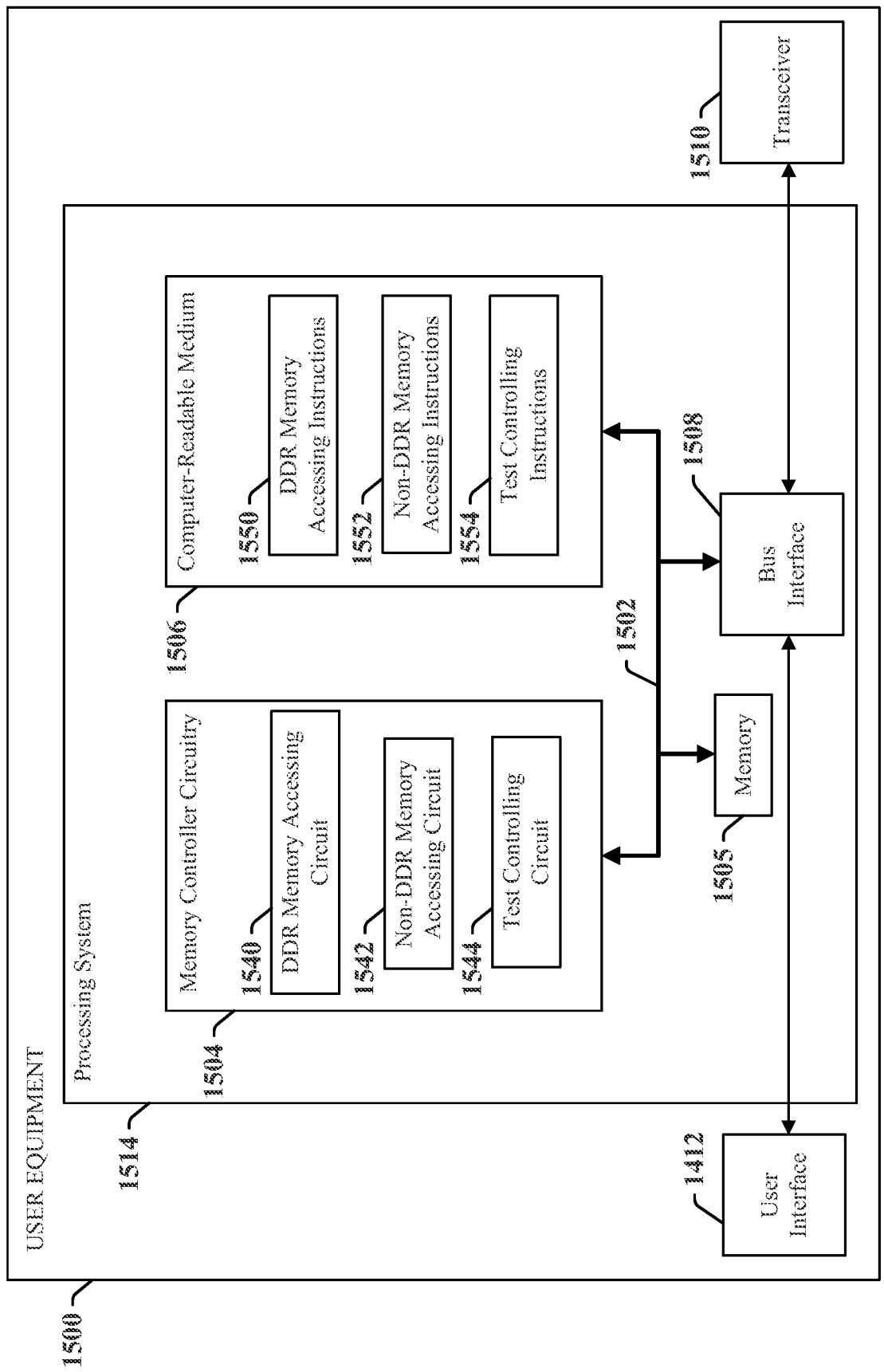

DUAL TAP ARCHITECTURE FOR ENABLING SECURE ACCESS FOR DDR MEMORY TEST CONTROLLER

CROSS-REFERENCE TO RELATED APPLICATIONS

This application claims priority to and the benefit of U.S. Provisional Application Ser. No. 62/757,021, entitled "DUAL TAP ARCHITECTURE FOR ENABLING SECURE ACCESS FOR DDR MEMORY TEST CONTROLLER" filed on Nov. 7, 2018, the entire contents of which is incorporated herein by reference as if fully set forth below in its entirety and for all applicable purposes.

BACKGROUND

Field

The present disclosure relates to a memory test control for double data rate (DDR) memories, and more particularly, to secure access and memory test control for stacked DDR dynamic random access memories (DRAM) within a system on chip (SoC) to run memory tests on the stacked DDR memories.

Background

In particular system on chip (SoC) structures and similar structures, double data rate (DDR) memory, such as Low Power DDR 4 (LPDDR4) or Low Power DDR 5 (LPDDR5) memory, is stacked within the SoC. Many DDR memory manufacturers provide that memory devices be tested according to particular tests, which are typically provided by the manufacturer. In the case of stacked memories, manufacturers also recommend that such memories be testable according to the complete memory tests. In such cases of stacked SoC structures, however, known interfaces to test DDR memory devices at speed are not available, which makes testing according to the suggested tests difficult. Moreover, it is difficult to distinguish a location of the causes of system failures should they occur. Accordingly, methods and apparatus for meeting test requirements that include the use of a built in test controller that is compatible with Joint Electron Device Engineering Council (JEDEC) standards and supports the particular DDR interface, such as a Low Power DDR 4 (LPDDR4) interface or a Low Power DDR 5 (LPDDR5) interface, in order to ensure the integrity of stacked DDR memories.

SUMMARY

Various features, apparatus and methods described herein relate to securely accessing and testing a double data rate (DDR) memory device.

According to an aspect, an apparatus for testing a memory device is disclosed that may be implemented within or as a mobile station, for example. The apparatus includes a first memory test access port (TAP) configured to enable or disable access to at least one double date rate (DDR) memory device, a second memory TAP configured to enable or disable access to at least one non-DDR memory device, and a test controller (e.g. memory built-in self-test (MBIST) controller) configured to test the at least one DDR memory device via the first memory TAP or test the at least one non-DDR memory device via the second memory TAP, wherein access to the at least one non-DDR memory device via the second memory TAP is disabled when access to the at least one DDR memory device via the first memory TAP is enabled.

According to another aspect, a method for testing a memory device is disclosed. The method includes enabling or disabling access to at least one double date rate (DDR) memory device via a first memory test access port (TAP), enabling or disabling access to at least one non-DDR memory device via a second memory TAP, and testing, via a test controller (e.g., MBIST controller), the at least one DDR memory device via the first memory TAP or the at least one non-DDR memory device via the second memory TAP, wherein access to the at least one non-DDR memory device via the second memory TAP is disabled when access to the at least one DDR memory device via the first memory TAP is enabled.

In yet another aspect, an apparatus for testing a memory device is disclosed. The apparatus includes first access means for enabling or disabling access to at least one double date rate (DDR) memory device, second access means for enabling or disabling access to at least one non-DDR memory device, and test controlling means for testing the at least one DDR memory device via the first access means or the at least one non-DDR memory device via the second access means, wherein access to the at least one non-DDR memory device via the second access means is disabled when access to the at least one DDR memory device via the first access means is enabled.

According to a further aspect, a non-transitory computer-readable medium storing computer-executable code is disclosed. The non-transitory computer-readable medium includes code for causing a computer to enable or disable access to at least one double date rate (DDR) memory device via a first memory test access port (TAP), enable or disable access to at least one non-DDR memory device via a second memory TAP, and test, via a test controller (e.g., MBIST controller), the at least one DDR memory device via the first memory TAP or the at least one non-DDR memory device via the second memory TAP, wherein access to the at least one non-DDR memory device via the second memory TAP is disabled when access to the at least one DDR memory device via the first memory TAP is enabled.

DRAWINGS

Various features and advantages may become apparent from the detailed description set forth below when taken in conjunction with the drawings in which like reference characters identify correspondingly throughout.

FIG. 15 illustrates a conceptual diagram illustrating an example of a hardware implementation for an exemplary User Equipment (UE) or mobile station in which aspects of the present disclosure may be implemented.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Memory built in self-test controllers or logic (e.g., MBISTs) ideally should support all of the various custom operations required to support custom testing and other algorithms that may be requested by different memory suppliers. DDR memory devices, and LPDDR4 (or LPDDR5) memory devices in particular, employed with system on chip (SoC) devices, such as DDRs stacked with a SoC, typically have memory supplier-imposed requirements that mandate extensive external memory testing. While a DDR is independently tested by a memory supplier, when DDRs are stacked there are situations where no interface to test such configured DDR memories at speed will be available. Accordingly, the presently disclosed methods and apparatus provide for testing of stacked DDR memories with an MBIST that may fully support various testing algorithms provided by different memory suppliers. Additionally, the presently disclosed methods and apparatus provide an MBIST that may be integrated within existing bus integrated memory controller (BIMC) designs with minimal interface changes. The present methods and apparatus further provide an MBIST design capable of affording custom operation sets and custom algorithms for various types of DDR memories, including LPDDR4/LPDDR5 memories, through the use of at least a translation finite state machine (FSM) or similar logic.

Figure 1:
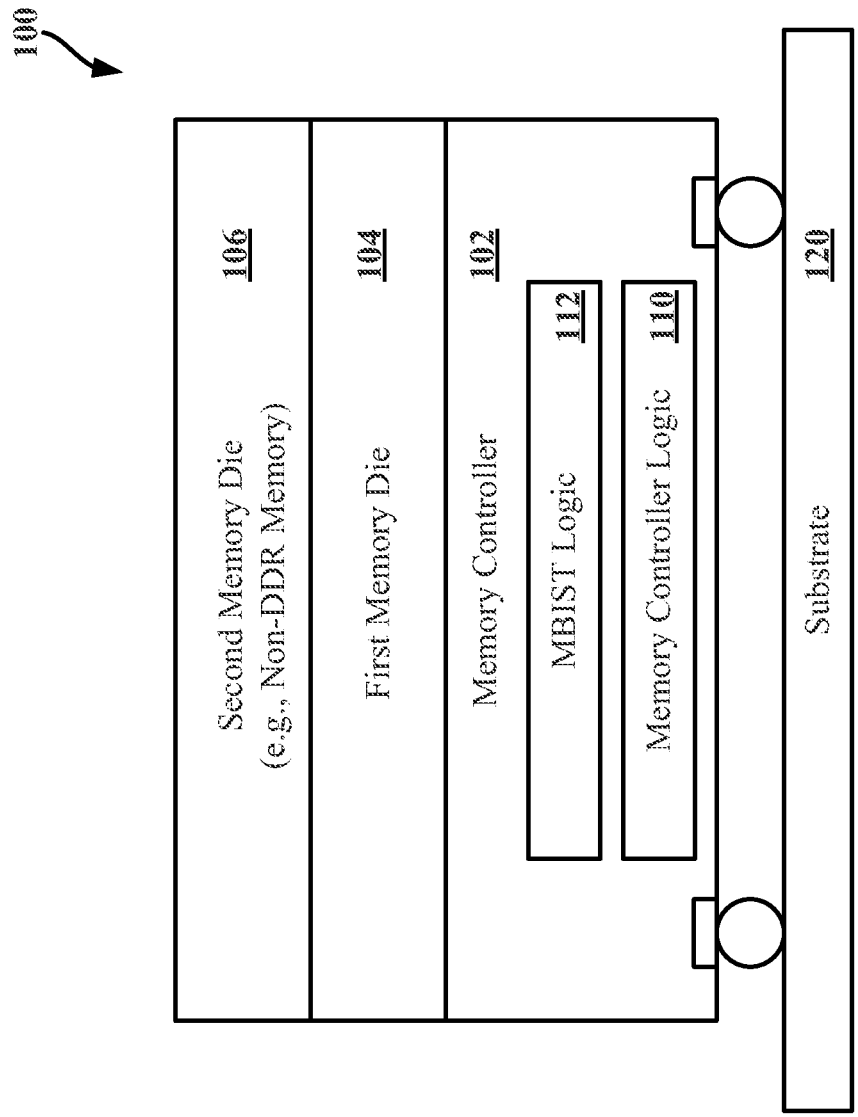
FIG. 1 illustrates an example of a memory package and a memory controller (MC), such as a bus integrated memory controller (BIMC) within a System on a Chip structure.

For contextualization, FIG. 1 illustrates an example of a package structure comprising a SoC system, for example, with stacked memory devices featuring a memory controller with an MBIST logic for testing the memory devices and running self-diagnosis tests to check the operation and/or functionality of the package. In particular, FIG. 1 illustrates a package 100 including a substrate 120, a memory controller 102 (e.g., on an application processor die), a first memory die 104 and a second memory die 106. In an aspect, the memory controller 102 may be located on top of the substrate 120. The memory controller 102 may include an MBIST logic 112 and a memory controller logic 110. It is noted here that although FIG. 1 illustrates an MBIST logic within the memory controller 102, the MBIST may alternatively be a test that is provided by a host via a communicative link or coupling that is, in turn, executed by the memory device or die. The first memory die 104 may be located on top of the memory controller 102 and the second memory die 106 may be located on top of the first memory die 104. Furthermore, in another alternative the first and second memory dies 104, 106 may also be located to the side of the memory controller 102 in a particular package configuration. In some implementations, at least one of the memories 104, 106 is a Double Data Rate Synchronous Dynamic Random Access Memory (DDR SDRAM). In other implementations the memory(s) 104, 106 is a memory configured as a LPDDR4 memory device (or LPDDR5 memory device). In further implementations, the first memory die 104 may be a Double Data Rate (DDR) Memory and the second memory die 106 may be a Non-DDR Memory (e.g., Flash Memory).

The memory controller 102 is configured for controlling access, writing, reading, and so forth for the first and second memory dies 104, 106. In some implementations, the control is performed by the memory controller logic 110. The MBIST controller or logic 112 is an example of a test controller and is configured for testing at least one or more memory dies, such as the first and second memory dies 104, 106.

As will be explained in more detail later, the MBIST controller or logic 112 may be defined by one or more circuits in the memory controller 102. Similarly, the memory controller logic 110 may be defined by one or more circuits in the memory controller 102. Although only two memory dies are shown, the package 100 may include more than two memory dies. In addition, the position of the dies may be located differently. For example, in some implementations the memory controller 102 may be located between the first memory die 104 and the second memory die 106. The memory controller 102 may also be located on top of the second memory die 106 in some implementations. The dies in package 100 may be electrically and communicatively coupled to each other by, for example, communicative coupling (e.g., chip-to-chip links) such as Through Silicon Vias (TSVs), wire bonding, and/or solder bumps in some implementations.

It is noted that the structure of FIG. 1 may be implemented within a mobile device, such a mobile station (MS), a User Equipment (UE), a cell phone, or any other mobile communicating device. Furthermore, the memory controller 102 may be part of a host, processor (e.g., an application processor), or processing circuitry of the mobile station.

Figure 2:
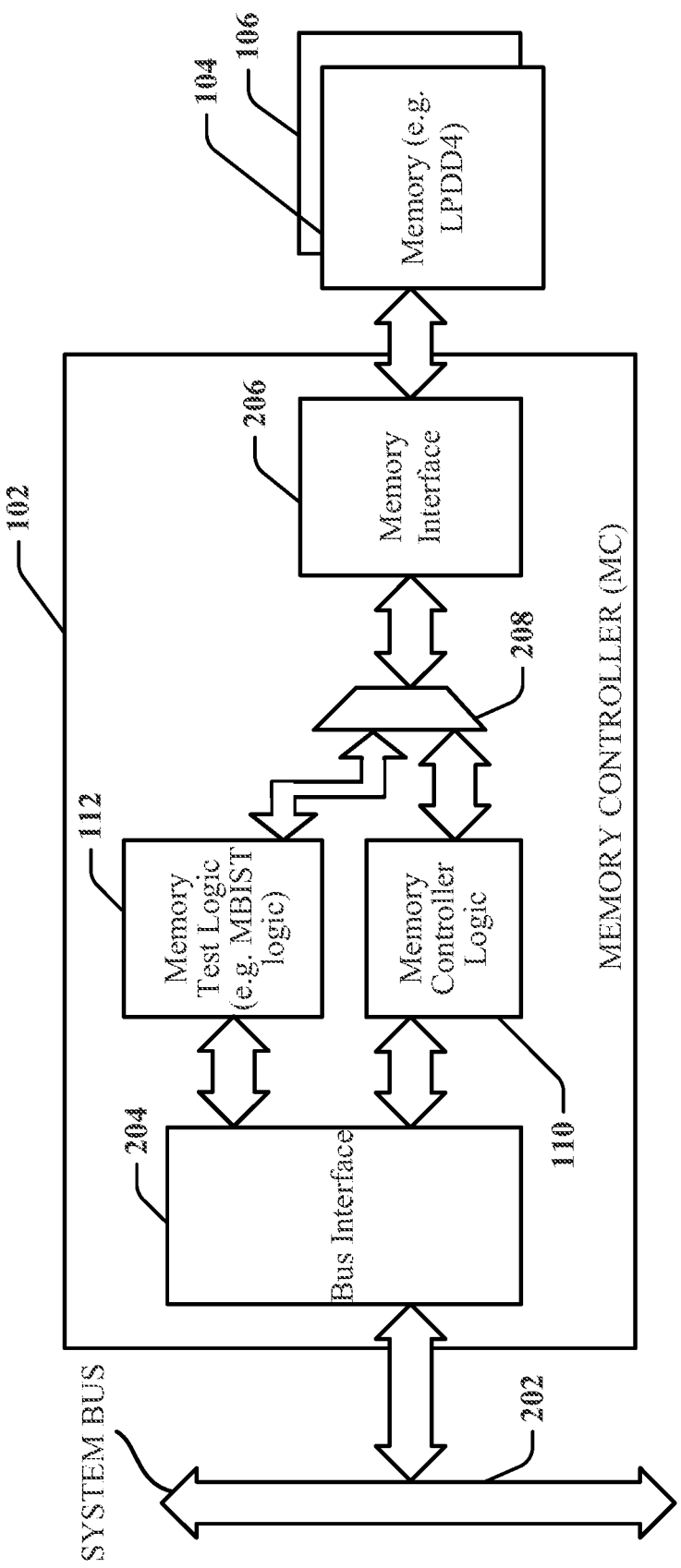
FIG. 2 illustrates an exemplary block diagram of a MC (e.g., BIMC) including a memory built-in self-test (MBIST) logic coupled between a bus and a memory device.

FIG. 2 illustrates an exemplary block diagram of a memory controller, such as memory controller 102. As may be seen, the memory controller 102, which may be a memory controller (MC), or in certain aspects, a bus interface memory controller (BIMC), includes the MBIST logic 112 and memory controller logic 110. As further shown in FIG. 2, the memory controller 102 is communicatively coupled to a communicative coupling or a system bus 202 configured for communication with the host or, alternatively, to other parts of the host via a bus interface 204. The memory controller 102 is also communicatively coupled to at least one memory 104 through a memory interface 206. The memory controller 102 controls the read and write operations of the memory 104. In one aspect, it is noted that the memory controller 102 may be part of a host device that is writing and reading data to the memory 104.

The memory test logic or MBIST logic 112 may also be coupled between the bus interface 204 and the memory interface 206. In order for the MBIST logic 112 to perform testing operations on the memory(s) 104, 106, the MBIST logic 112 communicates with and sends instructions in place of the memory controller logic 110. Thus, a switch interface 208 configured to selectively provide communicative coupling between the MBIST logic 112 and the memory interface 206 may be utilized. The switch interface 208, according to some aspects may be under the control of the MBIST logic 112, but the selection is not limited to such and could alternatively be effectuated by some external signal from a processor in a device or SoC employing the memory controller 102. Furthermore, the switch interface 208 may be separate from the memory interface 206, as illustrated, or incorporated within the memory interface 206 as will be shown in the example of FIG. 3. It is further noted that the switch interface 208 may be a multiplexer.

The memory controller logic 110 may perform control operations on the memory 104, 106 through the memory interface 206. For example, the memory controller logic 110 may perform read and write operations on the memory interface 206. These read and write operations may specify the location of the memory 104, 106 where data is written to and/or where data is read from.

The MBIST logic 112 may perform testing on the memory 104, 106 through the memory interface 206. The MBIST logic 112 may perform a variety of testing operations (e.g., using different testing algorithms and/or scans) as will be discussed in more detail later. These testing operations or scans may be selectable and/or programmable. In some implementations, the MBIST logic 112 may be programmable (e.g., program the types of tests that the MBIST logic can perform) through an interface (e.g., a Joint Test Action Group (JTAG) interface). Moreover, the MBIST logic 112 may be a separate circuit from the circuit of the memory controller logic of the memory controller in some implementations.

Figure 3:
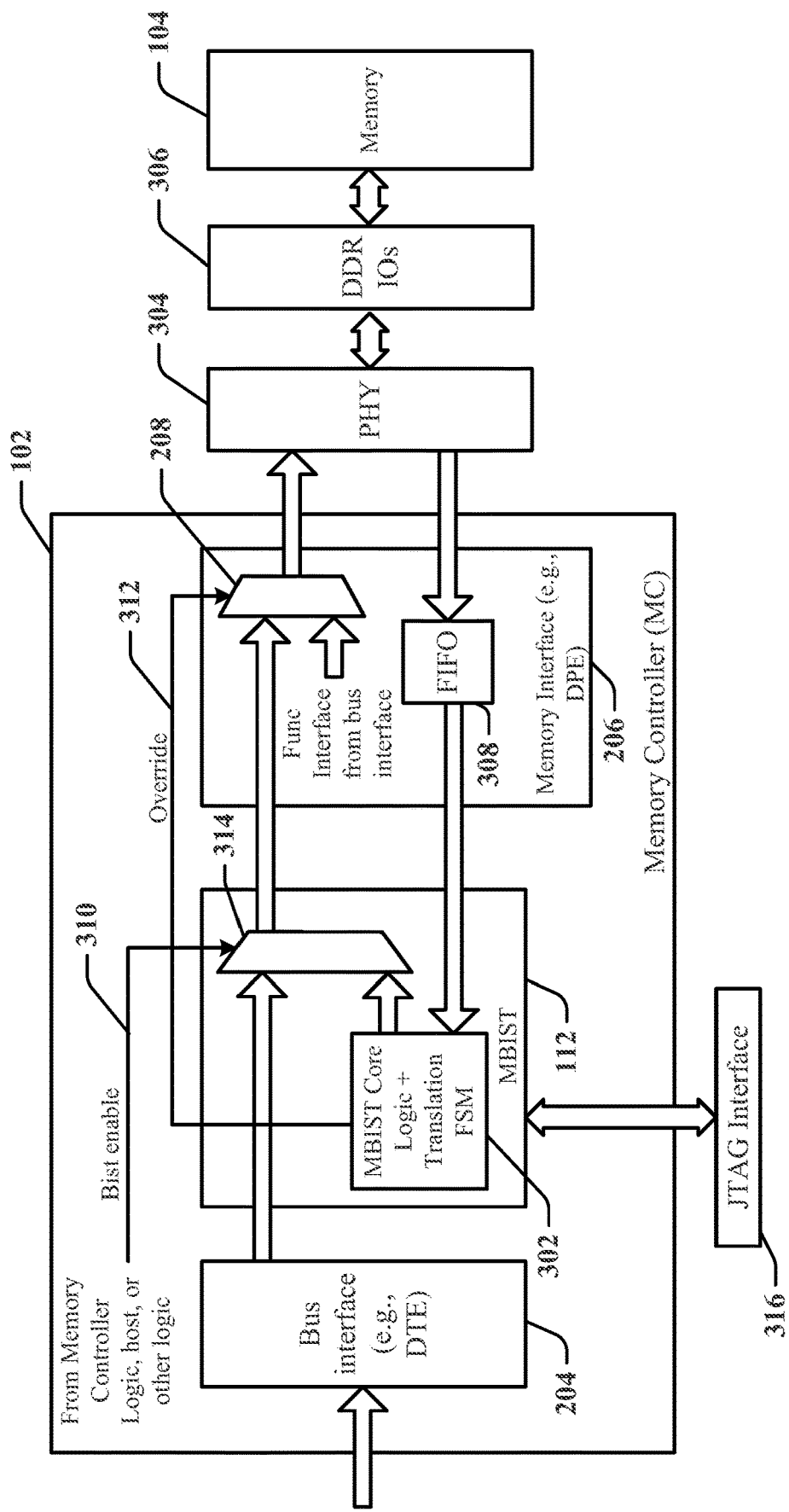
FIG. 3 illustrates an exemplary block diagram of the MC with an MBIST logic that is illustrated in FIG. 2.

FIG. 3 illustrates a more detailed block diagram of an exemplary implementation of the memory controller 102 utilizing MBIST logic 112. It is noted that the memory controller logic 110 has been omitted in this drawing for sake of clarity.

The MBIST logic 112 is located between the bus interface 204 and the memory interface 206 within the memory controller 102. A number of signals may be directly driven between the bus interface 204 and the memory interface 206. During testing, some of these signals are to be intercepted and driven with use of the MBIST logic 112 for testing the memories 104, 106. According to an aspect, the presently disclosed MBIST logic 112 provides a built-in memory test controller design that supports the extensive algorithm testing required for DDR memories, in particular, LPDDR4 or LPDDR5 stacked memories (or similar memory devices). In one example, MBIST logic 112 may be configured as a LPDDR4 or LPDDR5 memory test controller that is integrated in a memory controller design (i.e., the present disclosure does not necessarily pertain solely to modification of LPDDR4 or LPDDR5 memory controllers but could be utilized in any of a number of memory controller architectures such as an LPDDR2 memory controller architecture, for example).

As illustrated in FIG. 3, the MBIST logic 112 may feature an MBIST core logic 302. The MBIST core logic 302 may further include a translation finite state machine (FSM) or similar structure or functionality for translating commands and instructions to be able to interface with the memory interface 206 and the various memory connections (e.g., PHY interface (PHY 304), DDR input/output (DDR I/O 306)) and the memory itself (e.g., 104). The MBIST core logic 302 is further configured with custom operation sets and custom algorithms for a particular memory to be tested, such as an LPDDR4 or LPDDR5 memory. The logic further includes a translation state machine that translates MBIST signals into compatible commands for the memory to be tested. The translation state machine may effectuate a memory representation creation to make a tool believe that the memory is local, acting like a fake memory. The translation state machine may also have the tasks of generating I/O 306 and DDR PHY 304 signals required to read and write accurately from the memory.

The memory interface 206 also includes a First in First Out (FIFO) buffer 308 that receives the DDR data read back from the PHY/memories (304/104). The FIFO buffer 308 allows the MBIST core logic 302 to interface with the PHY/memories without needing to deal with DDR data synchronization. In another aspect, it is noted that DDR memory operates at a frequency (e.g., the DDR memory interface frequency) that is higher than the typical frequency for operating the memory controller 102. The memory interface, however, needs to operate at a frequency commensurate with the DDR operating frequency (e.g., the DDR memory interface frequency) to properly interface with the memory. For example, the DDR operating frequency may refer to a maximum DDR memory interface frequency specified by a specification, such as LPDDR4 or LPDDR5. The present disclosure thus further provides that the interface 206 allows the MBIST logic 112 and MBIST core logic 302 to operate at the same frequency as the memory controller 102, which is about half of the DDR frequency (i.e., a 1:2 ratio). In other aspects, the frequency ratio could be greater or lesser, depending on the particular memory being tested. In one example, the present disclosure allows for testing the DDR memory at the maximum DDR memory interface frequency.

The MBIST logic 112 is further configured to receive a BIST or MBIST enable signal 310 to cause or trigger the system to enter into a memory test mode and to generate an override signal 312 to switch the memory interface 206, via switch interface 208, between MBIST signals and functional interface signals passed between the bus interface 204 and the memory interface 206 in normal operation. In certain aspects, the MBIST enable signal 310 may be received from logic within the memory controller 102, or from logic or processing outside the memory controller 102. Alternatively, in some aspects the MBIST enable signal 310 may also be generated within MBIST logic 112 itself rather than being received from an external logic or processor. The override signal 312 may be configured to be generated by the MBIST core logic 302 and serves to select which input to switch for switch interface 208 (e.g., multiplexer) to output to the PHY/DDR I/Os/memory device; i.e., switch between either the input from MBIST logic 112 or the normal functional interface signals from bus interface 204 during standard memory control by memory controller 102 (or other logic used in operation of the memory control).

While switching or multiplexing between the functional and memory BIST signals is within the memory controller 102 (i.e., using switch interface 208 or multiplexer), additional switching or multiplexing, as represented by multiplexer 314, may be utilized at the output of the MBIST core logic and FSM (and, in particular, a memory representation as will be discussed later), due to requirements of particular memory and memory interface 206, as well as JEDEC specifications. The MBIST logic 112 is also configured to receive external instructions and data via a JTAG interface 316.

Figure 4:
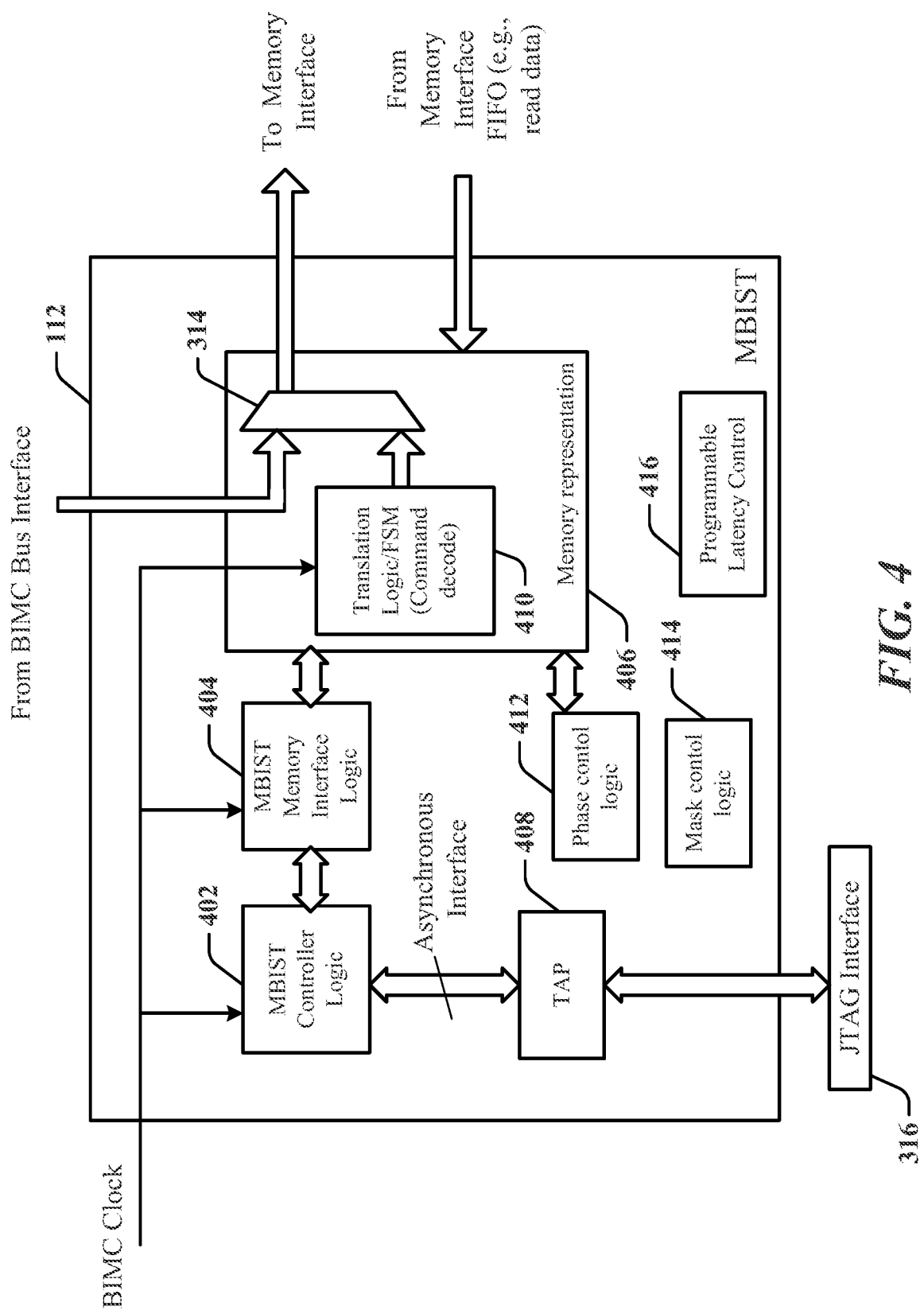
FIG. 4 illustrates an exemplary block diagram of the MBIST logic illustrated in FIG. 3.

FIG. 4 illustrates a more detailed block diagram of the MBIST logic 112 shown in FIGS. 2 and 3. It is first noted that the various logic blocks or components illustrated herein may be hardcoded and fixed. In other examples, however, the logic block or components may be configured or implemented and then connected with a memory configuration tool.

As may be seen in FIG. 4, the MBIST logic 112 (and more specifically according to a particular example, the MBIST core logic 302) may include an MBIST controller logic 402 that is clocked at the frequency of the memory controller clock. The MBIST controller logic 402 controls the operations of the MBIST logic 112 through an MBIST memory interface logic 404 that, in turn, interfaces with a memory representation transform logic or FSM 406, in particular. Since the memory device 104, 106 is external to the chip, a memory representation is created to make the memory device appear to be a local memory to the MBIST logic 112, thus acting as a type of proxy or false memory. In an aspect, it is noted that the memory representation model may contain specifications that inform an MBIST logic configuration tool the particular MBIST logic that is to be inserted or configured.

In an aspect, the MBIST core logic may be automatically generated and connected within the MBIST logic 112 by a memory configuration tool. The MBIST core logic may include the MBIST controller logic 402, the MBIST memory interface logic 404, as well as a test access port (TAP) 408. The TAP 408 is communicatively coupled with the JTAG interface 316, which may be configured as a master TAP that is located at the top-level of the chip or SoC and is configured to communicate with various TAP modules in the system. Furthermore, selection or multiplexing between functional and MBIST signals may be performed within the memory interface.

Figure 5:
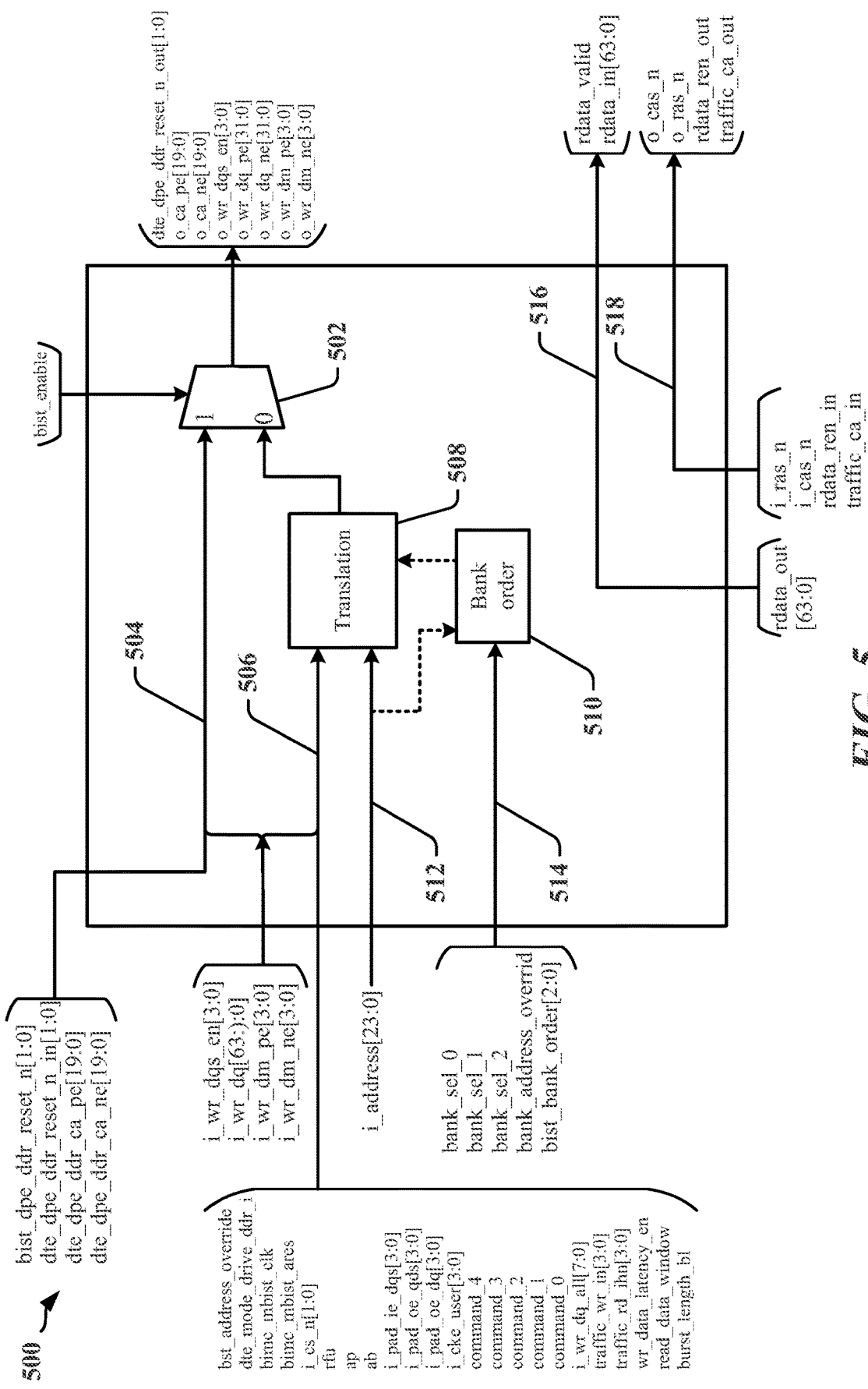
FIG. 5 illustrates an exemplary block diagram of at least a memory representation portion of the MBIST core logic illustrated in FIGS. 3 and 4.

FIG. 5 illustrates a memory representation 500 of at least a portion of the memory representation or memory representation logic 302 or FSM 406 shown in FIGS. 3 and 4. As noted above, a reason for utilizing a memory representation is that the memory device does not exist in the area parsed by the MBIST logic 112, and thus this memory representation logic is used to trick the logic into identifying the memory representation as a local memory, and proceed with a regular automatic insertion of the MBIST logic 112. Additionally, the MBIST logic 112 has flexibility to create signals with different purposes, but it cannot accurately create a group of signals that matches the functionality and timing expected by the memory interface 206. Accordingly, the memory representation shown in FIG. 5 provides the functionality to the MBIST logic 112 of being able to transform and adapt the signals between the MBIST logic 112 and the memory interface 206.

As illustrated in FIG. 5 a multiplexer 502 allows selection based on the MBIST enable signal (e.g., 310) of functional signals 504 or MBIST translation signals of various command and data signals 506 input to and translated by translation block 508. The translation block 508 provides the ability to translate MBIST signals into signals that are compatible with the memory interface 206 for testing of the memory devices 104, 106. The translation block 508 also may translate based on the input of a bank order block or logic 510 operable based on an input address 512 and blank selection and ordering signals 514.

The memory representation 500 also may include pass through signals 516, 518, for signals not affected by or pertinent to the MBIST logic 112. It is further noted that the various signals illustrated as input to the memory representation 500 and output therefrom are merely exemplary and the disclosure is not intended to be limited to such.

Figure 6:
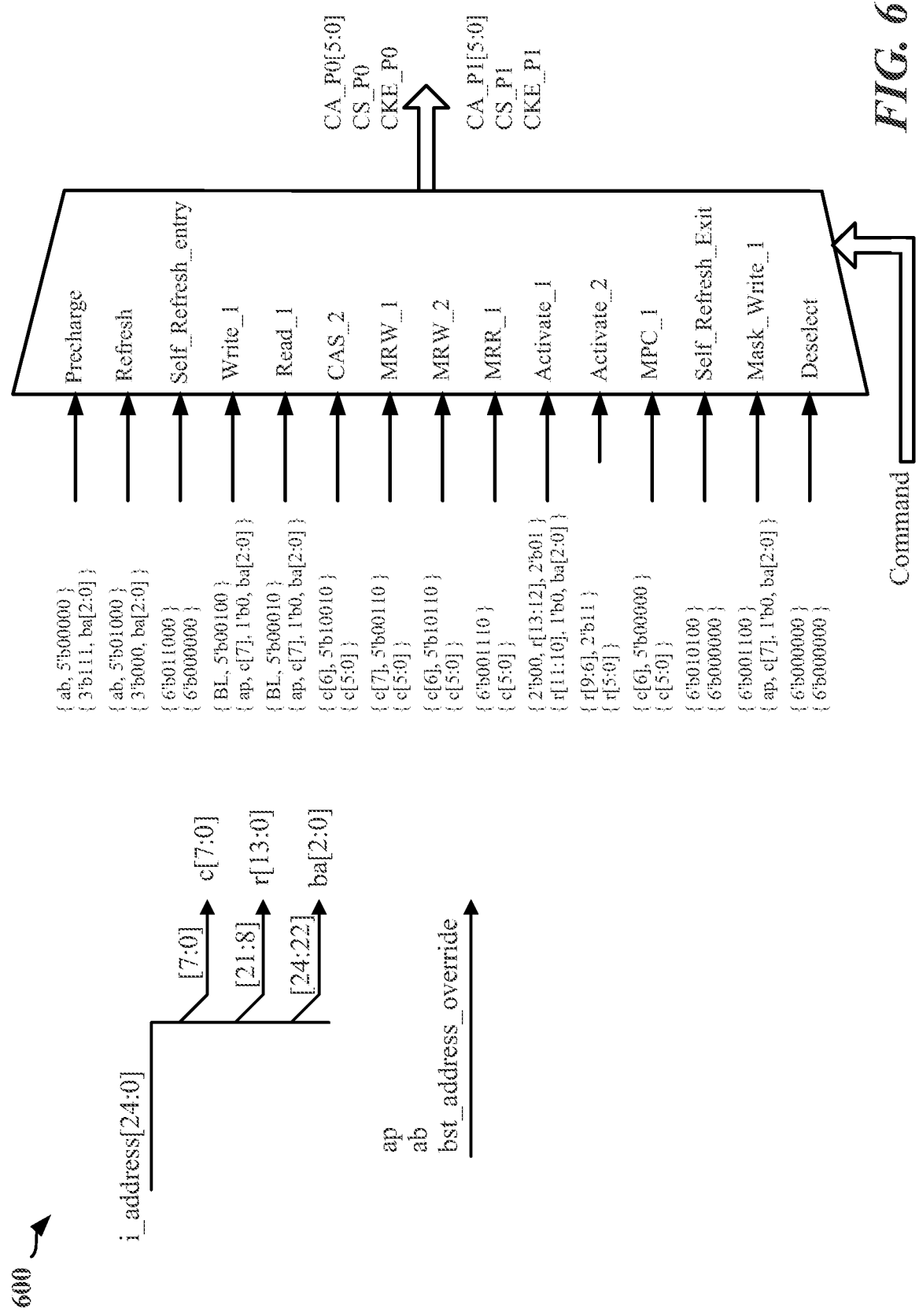
FIG. 6 illustrates an exemplary translation module that may be utilized within the memory representation within the MBIST logic of FIGS. 4 and 5.

FIG. 6 illustrates a diagram of an exemplary translation module or encoder 600 that may be located within the memory representation 500 of FIG. 5. The translation module or encoder 600 is configured to take the signals between the MBIST components and logic and the memory interface 206, and adapts the timing of these signals to enable the communication back and forth between the MBIST logic 112 and memory interface 206. As an example, any MBIST requests or signals from MBIST logic 112 such as address, activate, read enable, write enable, BIST user bit, User IR bits, precharge, etc. are converted into a corresponding request in the format that is interpretable by the memory interface 206. The translation FSM and translation module or encoder 600 also carries out the tasks of generating required I/O and DDR PHY Signals required to read and write accurately from the memory devices 104, 106. According to other aspects, the translation FSM may include programmable data (DQ) and strobe (DQS) delays to meet the memory device timing (i.e., DQ and DQS timing relations).

Figure 7:
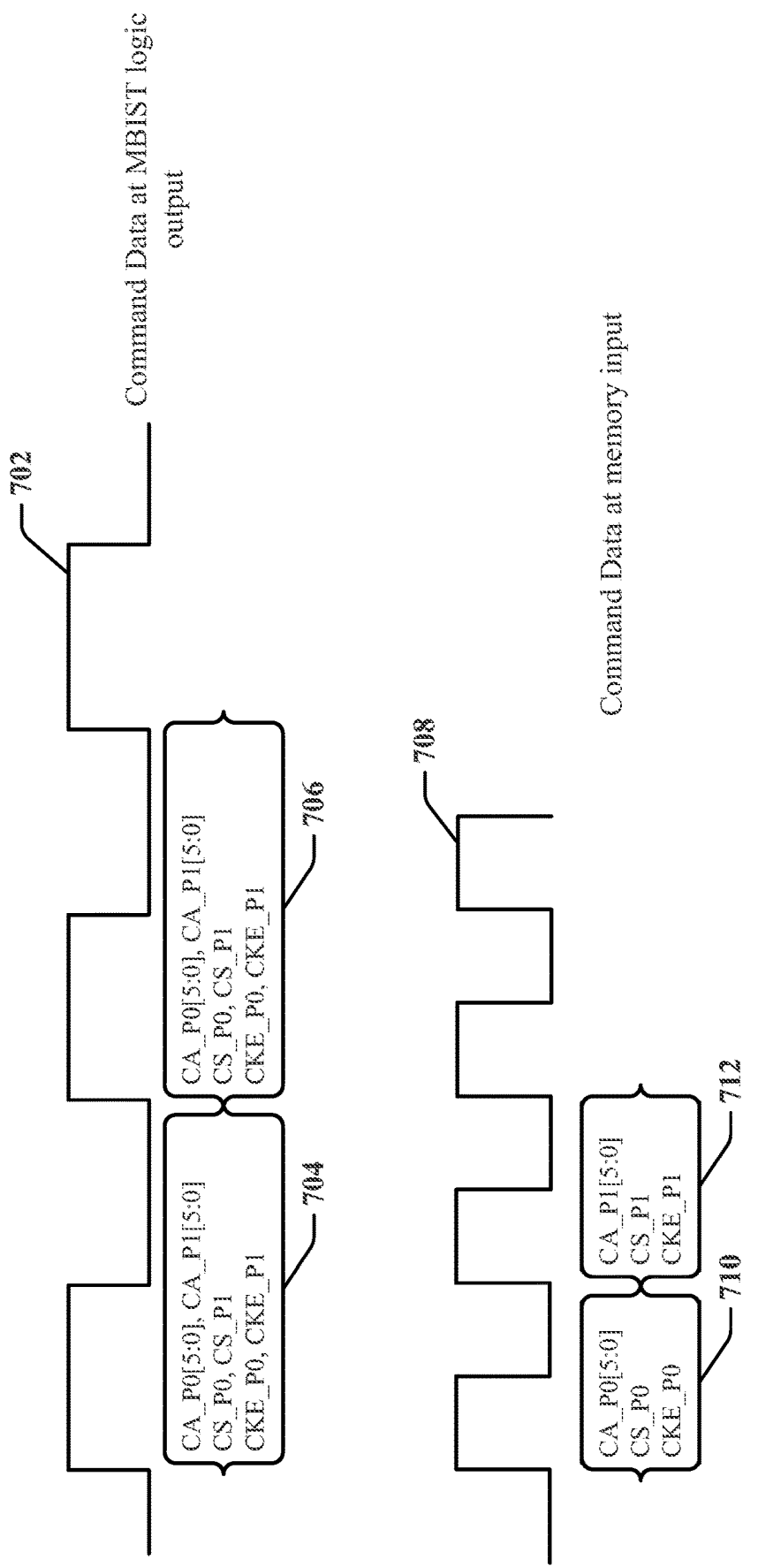
FIG. 7 illustrates a timing diagram of command data (e.g., CA/CS/CKE signals) within the MBIST logic and at an input of the memory where the timing frequency of the MBIST is a fraction of the memory operating frequency.

FIG. 7 illustrates a timing diagram of command data (e.g., CA/CS/CKE signals) at the MBIST logic output and at an input of the memory (or memory interface) where the timing frequency of the MBIST logic and signals for testing the memory is some fraction of the memory operating frequency. As illustrated, a clock signal 702 for the operation of the MBIST logic 112 operates at a particular frequency or clock cycle length. As may be seen, the command data 704 or 706 for first and second phases (P0, P1) is generated over a full cycle of the clock signal 702. As discussed above, however, the frequency of clock signal 702 at which the MBIST operates is lower than the operating frequency of the DDR memory devices, and in some aspects, is equal to the memory controller (MC) or BIMC clock.

After translation of MBIST signals of the MBIST logic 112 to be compatible with the memory interface (and memory devices), the DDR operating frequency is higher than the memory controller clock. In this example, the clock or operating frequency of clock 708 of the DDR memory devices is approximately twice that of the memory controller clock frequency of clock signal 702. Because the MBIST logic 112, or portions thereof including the interface, operates at approximately half of the frequency of the DDR memories (e.g., the DDR memory interface) and the CA operation is at Single Data rate (SDR) at the DDR memory, the MBIST logic needs to provide double the data for every MBIST logic clock cycle. Thus, the command data for phases P0 and P1 that was generated over a cycle of the MBIST clock signal 702 now is transmitted over two cycles of the clock 708 at which the DDR memories operate. Accordingly, the first phase P0 command data 710 is transmitted over a first cycle of the clock 708 and the second phase P1 command data 712 is transmitted over the next second cycle of clock 708. Accordingly, the present methods and apparatus provide for approximately 1:2 frequency support in the example of FIG. 7. It is noted, however, that the present disclosure is not limited to only 1:2 frequency support and other ratios may be contemplated to be within the scope of the present disclosure.

Figure 8:
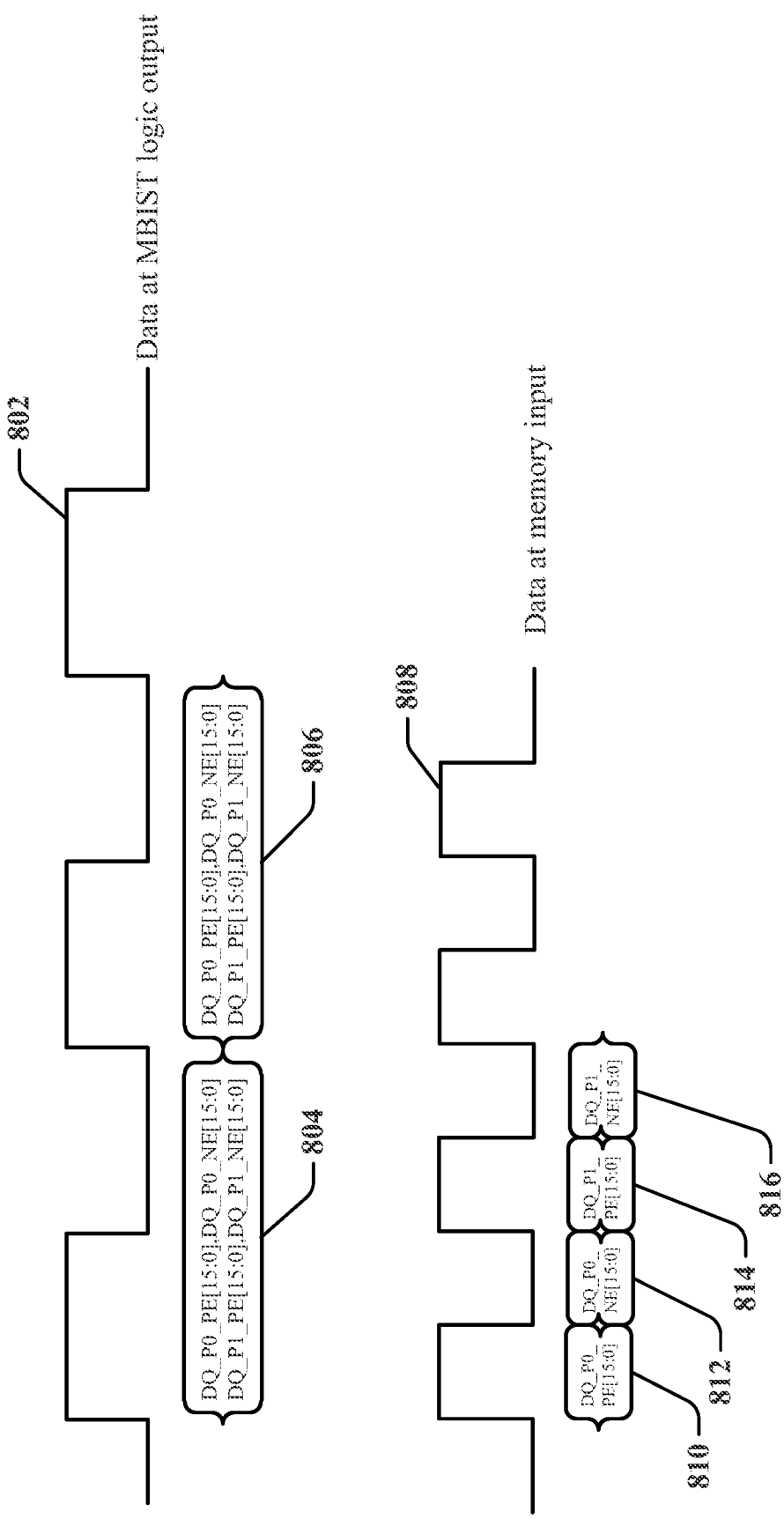
FIG. 8 illustrates a timing diagram of DQ data within the MBIST logic and at an input of the memory where the timing frequency of the MBIST logic is a fraction of the memory operating frequency.

FIG. 8 illustrates a timing diagram of DQ/DQS data within the MBIST logic and at an input of the memory where the timing frequency of the MBIST is a fraction of the memory operating frequency. Given the example of FIG. 7, if the MBIST logic (e.g., the interface of the MBIST logic) operates at a frequency that is approximately half of the frequency of DDR memory device and data operation is at Double Data rate (DDR) at the DDR memory, the MBIST logic will need to provide Four Word data at every cycle of the MBIST clock 802. As illustrated, this four word data is illustrated by data 804 or 806, and is data for both phase 0 and phase 1 modes (P0 and P1).

At the memory input, however, two data words are transmitted for each cycle of the DDR clock 808. Thus, the DQ for phase P0 is transmitted in the first cycle as shown by 810 and 812, and the DQ for phase P1 is transmitted over a second, subsequent cycle as may be seen by data 814 and 816.

Of further note, the strobe DQS consists of writeable signals and may be transported with write data on DDR bus. The Timing of DQ verses DQS may be taken care by the translation FSM according to some configurations.

Figure 9:
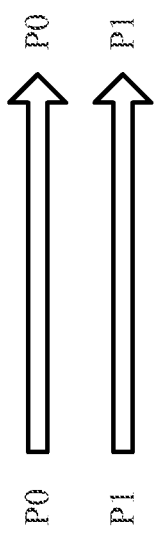
FIGS. 9 and 10 illustrate phase control including phase shifting according to an aspect of the present disclosure.
Figure 10:
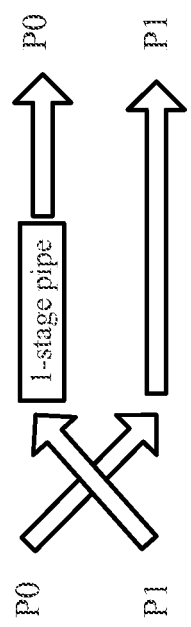

Because of the feature of the approximately 1:2 memory controller/DDR ratio discussed above, another aspect of the present disclosure is provision of phase control support to support phase control for CA/DQ/IE (input enable)/OE (output enable) buses. As the memory controller is operating at a frequency that is approximately half the frequency of DDR, there is a requirement to support the launch of commands and data on either of the P0 and P1 phases. Accordingly, the present disclosure provides for a phase support module in the MBIST logic (see e.g., phase control logic or module 412 in FIG. 4 as exemplary) to enable shifting of data/command/IE/OE, etc. by approximately one half cycle of the memory controller clock (or a full cycle of DDR DRAM clock), for example. As may be seen in FIG. 9, when commands and data are launched on a phase P0, then no shifting is necessary. However, when launch of commands or data start during phase 1, the phase 0 (P0) data is switched for transmission first, and the phase 1 (P1) is delayed or shifted a half cycle in a single state pipe, for example, for transmission during the next phase mode (e.g., P0) as is illustrated in FIG. 10.

According to another aspect of the present disclosure, a mask control functionality and/or logic (see e.g., exemplary logic 414 in FIG. 4) is provided to support several data mask (DM) sequence options for different MBIST algorithms that may be executed (e.g., DM sequences 0101-0101, 0011-0011, 0110-0110, or 0101-1010). In a particular example, MBIST native support of oddgroup-writeenable and even-group-writeenable commands have been modified to support the several different data mask algorithms. According to an aspect, the mask control feature is achieved by smart swapping the DM bus while integrating within the memory controller system. According to another aspect, the mask controls may be configured to be user selectable.

According to yet another aspect of the previous disclosure, rather than rely upon hard-coded latencies used for each operation set for every frequency of operation, the present disclosure provides a programmable latency control for one or more signals (see e.g., exemplary control block 416 in FIG. 4). In an aspect, programmable latency control may be provided for one or more of the following signals: write latency; Read (rd_traffic etc.) Latency; Read_enable latency; IE/OE programmable latency with phase control; programmable data polarity latency; Inhibit_data compare, or Expect_data command select, and Strobe latency, as a few examples. It is noted that hard-coded latencies in previously known systems resulted in a huge operation set area. The present programmable latency control affords a reduction of approximately 30% of the operation set area. Furthermore, it is noted that the programmable latency control affords the ability to support a number of different latencies, including JEDEC latencies.

Aspects of the present disclosure relate to an extensive structural memory test of stacked DDR memory (e.g., LPDDR4 memory or LPDDR5 memory). In a detailed aspect, the present disclosure relates to mobile data modems (MDMs) having LPDDR4 (or LPPDDR5) memory stacked with a system on chip (SoC). While the LPDDR4/LPDDR5 memory may be independently tested by a memory supplier, when stacked, no interface may exist to test the LPDDR4/LPDDR5 memory at speed. Accordingly, the present disclosure provides for a systematic methodology and design to facilitate access to the LPDDR4/LPDDR5 memory by a memory supplier/tester in order to test the LPDDR4/LPDDR5 memory and diagnose failures while securing other memories (that may store proprietary information) from the memory supplier/tester.

Figure 11:
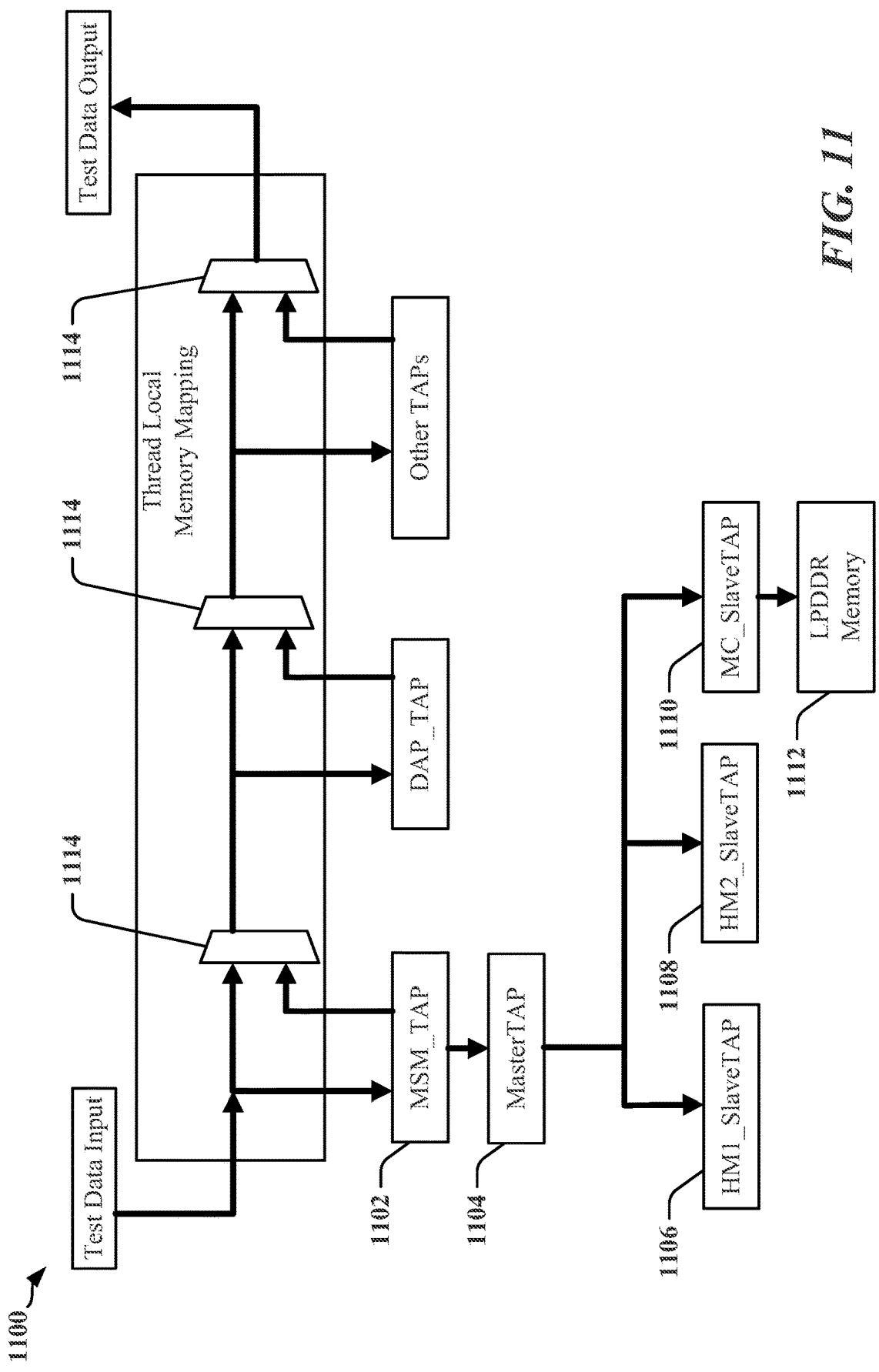
FIG. 11 is a diagram of an existing MBIST architecture.

FIG. 11 is a diagram of a MBIST architecture 1100. The MBIST architecture 1100 allows for the testing of memories of a hardware module (HM) through a test access port (TAP) or slave TAP in the same HM. Depending on the robustness of the design, a chip may have numerous (e.g., hundreds of) slave TAPs, such as a first HM slave TAP (HM1_SlaveTAP) 1106, a second HM slave TAP (HM2_SlaveTAP) 1108, and a memory controller slave TAP (MC_SlaveTAP) 1110. Accordingly, a master TAP (MasterTAP) 1104 may be implemented in the MBIST architecture 1100 to facilitate the selection of the appropriate slave TAP (e.g., MC_SlaveTAP 1110) depending on the memory (e.g., LPDDR memory 1112) that is required to be tested.

The MBIST architecture 1100 has a daisy chain of TAPs that are accessed by programming control registers using switch interfaces/multiplexers 1114. The MasterTAP 1104 in the MBIST architecture 1100 is accessed through a SoC TAP (MSM_TAP 1102), which may be just one of the many TAPs in the architecture. Testing a DDR memory (e.g., LPDDR memory 1112) requires control over a specific slave TAP (e.g., MC_SlaveTAP 1110). To access the MC_SlaveTAP 1110 and corresponding memory (LPDDR memory 1112), control is transferred from the MSM_TAP 1102 in the daisy chain to the MasterTAP 1104, from which a specific slave TAP (MC_SlaveTAP 1110) is selected, which in turns provides access to the corresponding memory (e.g., LPDDR memory 1112) that is required to be tested. Thus, any memory can be accessed if access to the MasterTAP 1104 is available.

However, a problem occurs when a memory supplier/tester is granted access to the DDR memories for testing via the MasterTAP 1104. Once the memory supplier/tester has access to the MasterTAP 1104, the memory supplier/tester is granted unhindered access to all other slave TAPs (e.g., HM1_SlaveTAP 1106 and HM2_SlaveTAP 1108) and their corresponding memories, which may contain proprietary information. Hence, a security hole is created when providing a DDR memory supplier/tester with access to the MC_SlaveTAP 1110.

For many MDM chips, DDR memory is stacked with the SoC. Moreover, product requirements may mandate extensive external memory testing. This may be due to the fact that while the DDR memory is independently tested by the memory supplier, there is no secure way of providing access to the stacked DDR memories alone. Also, as DDR memories sit hierarchically deep inside the architecture, proving access to the DDR memories while secluding access to other memories may be a cumbersome task.

In an aspect, a mobile data modem (MDM) chip may be implemented with LPDDR4/LPDDR5 memories. Thus, a LPDDR4/LPRDDR5 memory test architecture may be provided to support LPDDR4/LPDDR5 MBIST on the MDM chip. To avoid any security holes created by the test architecture (i.e., avoid granting a memory supplier/tester with unhindered access to memories storing proprietary information), a dual MasterTAP design may be implemented in the MDM chip.

Figure 12:
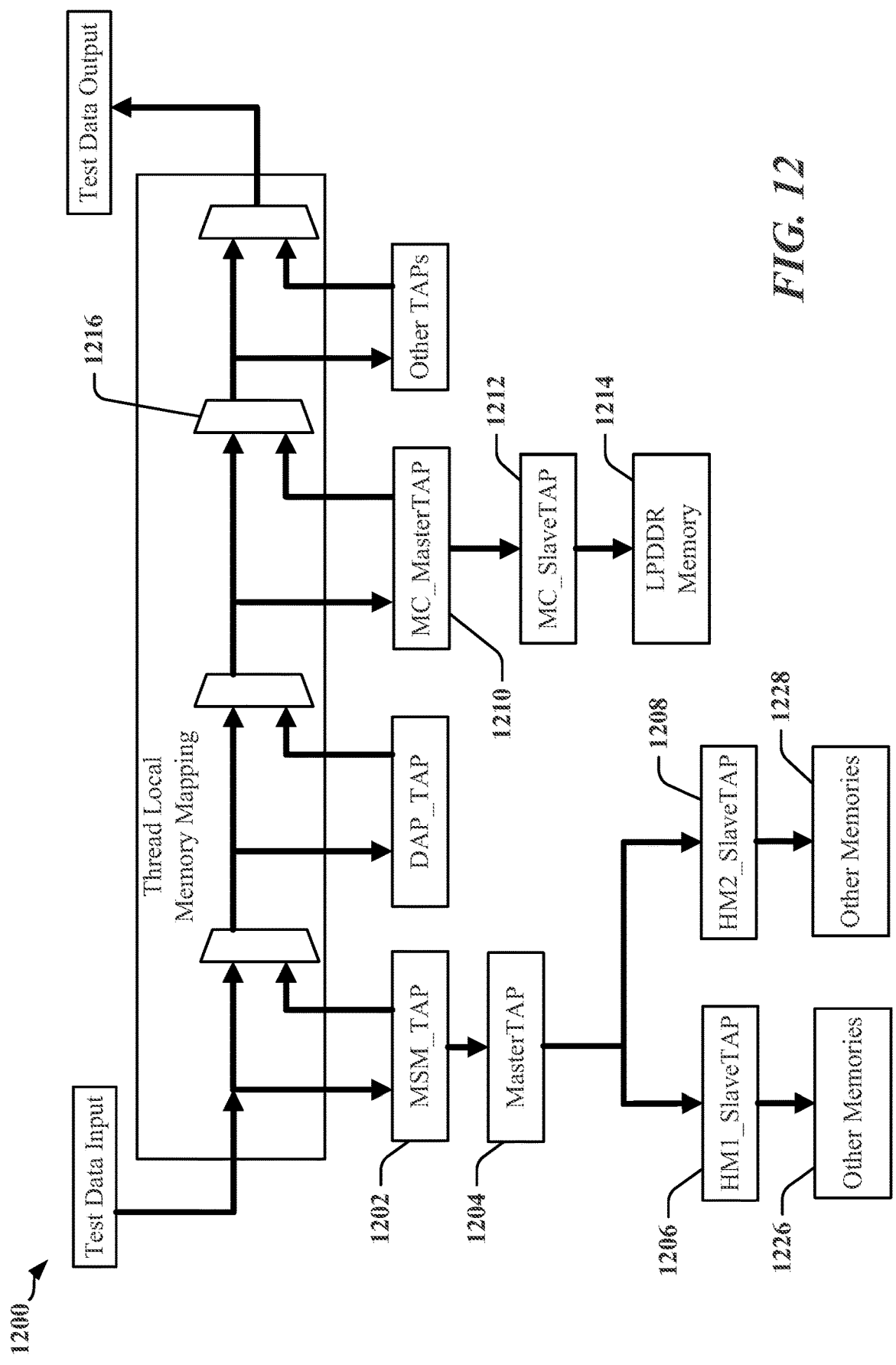
FIG. 12 is a diagram of an MBIST architecture according to aspects of the present disclosure.

FIG. 12 is a diagram of an MBIST architecture 1200 according to aspects of the present disclosure. The MBIST architecture 1200 allows for the testing of memories of a hardware module (HM) through a test access port (TAP) or slave TAP in the same HM. Depending on the robustness of the design, a chip may have numerous (e.g., hundreds of) slave TAPs, such as a first HM slave TAP (HM1_SlaveTAP) 1206, a second HM slave TAP (HM2_SlaveTAP) 1208, and a memory controller slave TAP (MC_SlaveTAP) 1212. In an aspect, a first master TAP (MasterTAP) 1204 may be implemented in the MBIST architecture 1200 to facilitate the selection of an appropriate slave TAP (e.g., HM1_SlaveTAP 1206 or HM2_SlaveTAP 1208) depending on the memory (other memory (e.g., non-DDR memory) 1226 or other memory (e.g., non-DDR memory) 1228) that is required to be tested.

The MBIST architecture 1200 has a daisy chain of TAPs that are accessed by programming control registers using switch interfaces/multiplexers. The first master TAP (MasterTAP) 1204 in the MBIST architecture 1200 is accessed through a SoC TAP (MSM_TAP 1202), which may be just one of the many TAPs in the architecture. Testing a memory corresponding to the HM1_SlaveTAP 1206 or the HM2_SlaveTAP 1208 requires control over the HM1_SlaveTAP 1206 or the HM2_SlaveTAP 1208. To access the HM1_SlaveTAP 1206 or the HM2_SlaveTAP 1208 (and a corresponding memory), control is transferred from the MSM_TAP 1202 in the daisy chain to the MasterTAP 1204, from which the HM1_SlaveTAP 1206 or the HM2_SlaveTAP 1208 is selected, which in turns provides access to the corresponding memory that is required to be tested.

In a further aspect, a second master TAP (memory controller master TAP (MC_MasterTAP)) 1210 may be implemented in the MBIST architecture 1200 to facilitate the selection of the MC_SlaveTAP 1212 in order to test a LPDDR memory 1214. Notably, instead of providing a memory supplier/tester with access to the MasterTAP 1204 to access the MC_SlaveTAP 1212 (as described above with respect to FIG. 11), a novel TAP (MC_MasterTAP 1210) is provided in the daisy chain that only provides access to the MC_SlaveTAP 1212 for testing the LPDDR memory 1214. Such an architectural improvement provides the advantage of not having to give the memory supplier/tester control of the MasterTAP 1204 through which other memories are accessible. Hence, the memory supplier/tester is prevented from gaining unhindered access to other TAPs (e.g., HM1_SlaveTAP 1206 and/or HM2_SlaveTAP 1208) in the architecture that provide access to memories containing proprietary information. In an aspect, the MBIST architecture 1200 may include at least one fuse or a switch interface/multiplexer 1216 that enables/disables access to the MC_MasterTAP 1210.

Figure 13:
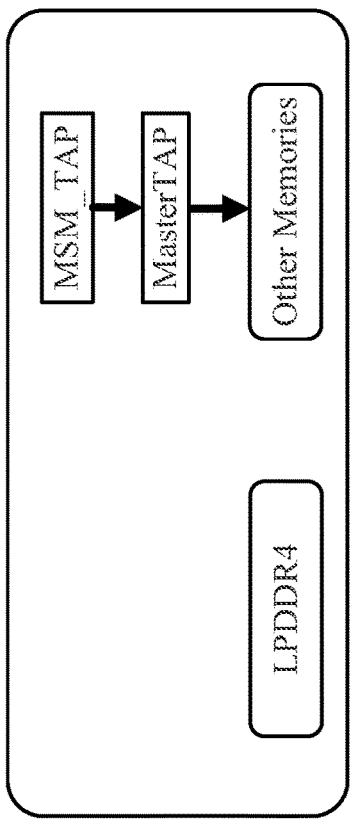
FIG. 13 is a diagram illustrating a MBIST insertion procedure for a LPDDR4 memory test controller according to aspects of the present disclosure.
Figure 13:
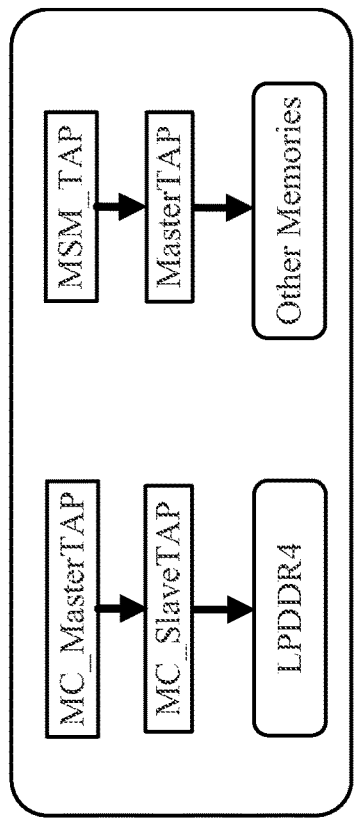
Figure 13:
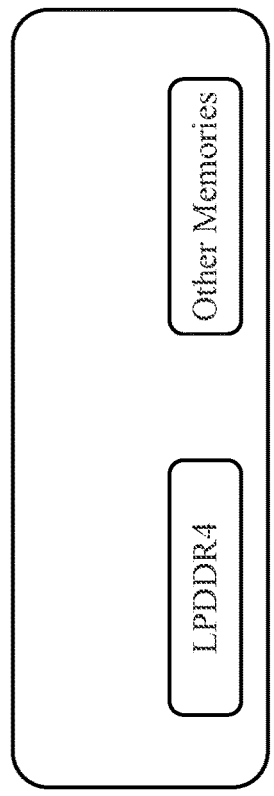
Figure 13:
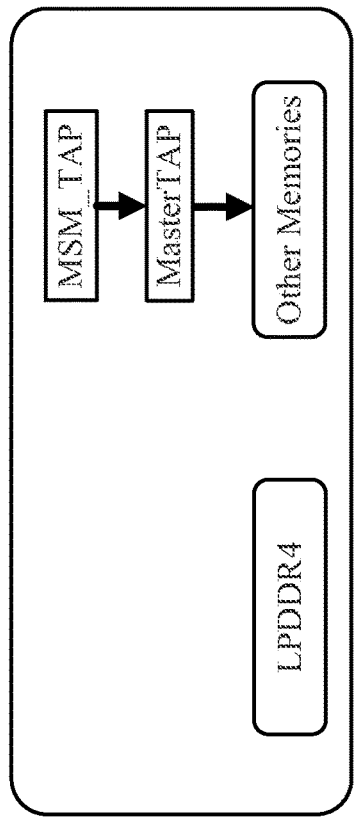

FIG. 13 is a diagram illustrating a MBIST insertion procedure 1300 for a LPDDR4 memory test controller according to aspects of the present disclosure. Notably, the procedure described with respect to FIG. 13 may also be applied to a LPDDR5 memory test controller. In the MBIST insertion procedure 1300, a first process 1302 involves isolating (e.g., black-boxing) the LPDDR memories from all other memories. A second process 1304 involves creating a first master TAP (MasterTAP) and forming a connection between the MSM_TAP and the MasterTAP. The second process 1304 further involves forming a connection from the MasterTAP to all hardware modules and corresponding memories except for the LPDDR memories. A third process 1306 involves creating MBIST logic for the LPDDR4 memories by taking as input the output of the second process 1304. Accordingly, the third process 1306 involves isolating (e.g., black-boxing) all memories that are not LPDDR4 memories. A fourth process 1308 involves performing a MBIST insertion. This process creates a second master TAP (memory controller master TAP (MC_MasterTAP)) that can specifically access the LPDDR4 memories via a memory controller slave TAP (MC_SlaveTAP) but no other memories.

Aspects of the present disclosure provide a number of advantages. For example, the dual MasterTAP architecture of the present disclosure helps to meet product requirements of stacked LPDDR4/LPDDR5 memory testing for MDM devices. The dual MasterTAP architecture of the present disclosure also helps to achieve an area reduction (e.g., 30% area reduction) of a stacked memory test controller using programmable latency control. The dual MasterTAP architecture of the present disclosure further provides a comprehensive solution for stacked LPDDR4/LPDDR5 memory test without a major design change and/or increased overhead.

Figure 14:
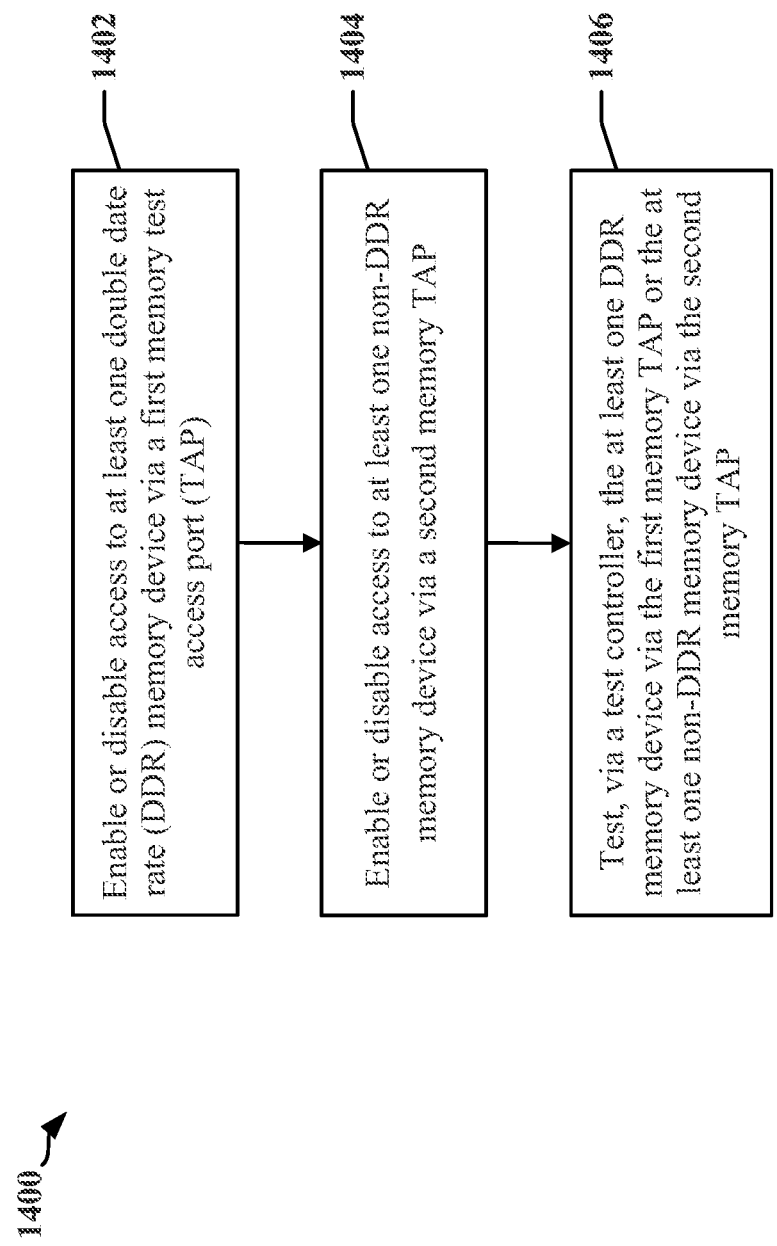
FIG. 14 illustrates an exemplary method for securely accessing and testing a memory device according to aspects of the present disclosure.

FIG. 14 illustrates an exemplary method 1400 for securely accessing and testing a memory device. The method 1400 includes enabling or disabling access to at least one double date rate (DDR) memory device (e.g., LPDDR memory 1214) via a first memory test access port (TAP) (e.g., MC_MasterTAP 1210) as illustrated in block 1402. The enabling or disabling process of block 1402 may include enabling or disabling access to the first memory TAP via at least one fuse. Moreover, the process of block 1402 may be effectuated by the memory controller 102 and/or a test controller (e.g., the MBIST controller or logic 112), as well as other controllers or logic for enabling or disabling access to a memory device.

The method 1400 further includes enabling or disabling access to at least one non-DDR memory device (e.g., other memory (non-DDR memory) 1226 or other memory (non-DDR memory) 1228) via a second memory TAP (e.g., MasterTAP 1204) as illustrated in block 1404. The process of block 1404 may be effectuated by the memory controller 102 and/or a test controller (e.g., the MBIST controller or logic 112), as well as other controllers or logic for enabling or disabling access to a memory device.

The method 1400 also includes testing, via a test controller (e.g., MBIST controller), the at least one DDR memory device via the first memory TAP or the at least one non-DDR memory device via the second memory TAP as illustrated in block 1406. The process of block 1406 may be effectuated by the memory controller 102 and/or the MBIST controller or logic 112, as well as other controllers or logic for testing a memory device.

In an aspect of the disclosure, the at least one DDR memory device is at least one Low Power DDR 4 (LPDDR4) memory device or Low Power DDR 5 (LPDDR5) memory device. In a further aspect, the at least one non-DDR memory device contains proprietary information. In another aspect, access to the at least one non-DDR memory device via the second memory TAP is disabled when access to the at least one DDR memory device via the first memory TAP is enabled.

In an aspect, a host (or host device) incorporates the first memory TAP, the second memory TAP, and the MBIST controller. In a further aspect, an apparatus includes the host device, the at least one DDR memory device, the at least one non-DDR memory device, and a communicative coupling configured to communicate signals for testing from the MBIST controller to the at least one DDR memory device via the first memory TAP or the at least one non-DDR memory device via the second memory TAP. In a further aspect, the at least one DDR memory device and the at least one non-DDR memory device are included in a same memory package (e.g., package 100). In yet another aspect, the apparatus may include a mobile phone or a mobile communicating device that incorporates the host device, the at least one DDR memory device, the at least one non-DDR memory device, and the communicative coupling.

FIG. 15 is a conceptual diagram illustrating an example of a hardware implementation for an exemplary User Equipment (UE) 1500 or mobile station employing a processing system 1514. In accordance with various aspects of the disclosure, an element, or any portion of an element, or any combination of elements may be implemented with a processing system 1514 that includes one or more processors 1504. The processing system 1514 may have an architecture including a bus interface 1508, a bus 1502, memory 1505 (e.g., a stacked LPDDR4/LPDDR5 memory or other memory (non-DDR memory)), a processor 1504, and a computer-readable medium 1506. Furthermore, the UE 1500 may include a user interface 1512 and a transceiver 1510.

In some aspects of the disclosure, the processor 1504 may include, DDR memory accessing circuitry 1540 configured for various functions. For example, the circuitry 1540 may be configured to enable or disable access to at least one double date rate (DDR) memory device via a first memory test access port (TAP), enable or disable access to the first memory tap, and/or implement one or more of the functions or circuitry/logic described above in relation to FIGS. 2-14. Furthermore, one or more of processing system 1514, processor 1504, and/or DDR memory accessing circuitry 1540, and equivalents thereof, may constitute first access means for enabling or disabling access to at least one double date rate (DDR) memory device and third access means for enabling or disabling access to the first access means.

In some other aspects of the disclosure, the processor 1504 may include non-DDR memory accessing circuitry 1542 configured for various functions. For example, the circuitry 1542 may be configured to enable or disable access to at least one non-DDR memory device via a second memory TAP and/or implement one or more of the functions or circuitry/logic described above in relation to FIGS. 2-14. Furthermore, one or more of processing system 1514, processor 1504, and/or non-DDR memory accessing circuitry 1542, and equivalents thereof, may constitute second access means for enabling or disabling access to at least one non-DDR memory device.

In some other aspects of the disclosure, the processor 1504 may include test controlling (e.g., MBIST controlling) circuitry 1544 configured for various functions. For example, the circuitry 1544 may be configured to test, via a test controller (e.g., memory built-in self-test (MBIST) controller), the at least one DDR memory device via the first memory TAP or the at least one non-DDR memory device via the second memory TAP and/or implement one or more of the functions or circuitry/logic described above in relation to FIGS. 2-14. Furthermore, one or more of processing system 1514, processor 1504, and/or test controlling circuitry 1544, and equivalents thereof, may constitute test controlling means for testing the at least one DDR memory device via the first memory TAP or the at least one non-DDR memory device via the second memory TAP.

One or more processors 1504 in the processing system 1514 may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1506. The computer-readable medium 1506 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 1506 may reside in the processing system 1514, external to the processing system 1514, or distributed across multiple entities including the processing system 1514. The computer-readable medium 1506 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In one or more examples, the computer-readable medium 1506 may include DDR memory accessing instructions/software/code 1550 configured for various functions, including, for example, enabling or disabling access to at least one double date rate (DDR) memory device via a first memory test access port (TAP). The DDR memory accessing instructions/software/code 1550 may be configured to implement one or more of the functions described above in relation to FIGS. 2-14, including, e.g., block 1402 in FIG. 14.

The computer-readable medium 1506 may also include non-DDR memory accessing instructions/software/code 1552 configured for various functions, including, for example, enabling or disabling access to at least one non-DDR memory device via a second memory TAP. The non-DDR memory accessing instructions/software/code 1552 may be configured to implement one or more of the functions described above in relation to FIGS. 2-14, including, e.g., block 1404 in FIG. 14.

The computer-readable medium 1506 may also include test controlling (e.g., MBIST controlling) instructions/software/code 1554 configured for various functions, including, for example, testing, via a test controller (e.g., memory built-in self-test (MBIST) controller), the at least one DDR memory device via the first memory TAP or the at least one non-DDR memory device via the second memory TAP. The test controlling instructions/software/code 1554 may be configured to implement one or more of the functions described above in relation to FIGS. 2-14, including, e.g., block 1406 in FIG. 14.

In other aspects, an apparatus that may be implemented in UE 1500 may include a memory (e.g., 1505) receiving one or more instructions for testing the memory, with the instructions including a command for initiating an MBIST operation within a memory controller (MC) including placing an MBIST logic in communication with the memory device. Further, the instruction may include a command for translating one or more commands and data from the MBIST logic with a memory translation logic for testing the memory device into signals in a format that are compatible with the memory device.

One or more of the components, steps, features, and/or functions illustrated in FIGS. 2, 3, 4, 5, 6, 13, and/or 14 may be rearranged and/or combined into a single component, step, feature or function or embodied in several components, steps, or functions. Additional elements, components, steps, and/or functions may also be added without departing from the aspects of the disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described in the figures. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another, even if they do not directly physically touch each other.

Also, it is noted that the aspects may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The terms "computer-readable medium," "machine readable medium," or "machine readable storage medium" include, but are not limited to portable or fixed storage devices, optical storage devices, wireless channels and various other mediums capable of storing, containing or carrying instruction(s) and/or data. Furthermore, in aspects of the present disclosure, a non-transitory computer-readable medium storing computer-executable code may be provided. Such code may be configured for causing a computer to: implement within a memory controller (MC) a memory built-in self-test (MBIST) function or equivalent logic functionality configured for testing at least one memory device. Further, the code may cause a computer translate, using the MBIST function, signals for testing the at least one memory device into signals in a format that is used by the at least one memory device.

Furthermore, aspects may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits (e.g., processing circuit), elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the aspects of the disclosure described herein can be implemented in different systems without departing from the aspects. It should be noted that the foregoing aspects of the disclosure are merely examples and are not to be construed as limiting the aspects. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus for testing a memory device, comprising:
 a first memory test access port (TAP) configured to enable or disable access to at least one double data rate (DDR) memory device;
 a second memory TAP configured to enable or disable access to at least one non-DDR memory device; and
 a test controller configured to test the at least one DDR memory device via the first memory TAP or test the at least one non-DDR memory device via the second memory TAP,
 wherein access to the at least one non-DDR memory device via the second memory TAP is disabled when access to the at least one DDR memory device via the first memory TAP is enabled.

2. The apparatus of claim 1, wherein the at least one DDR memory device is at least one Low Power DDR 4 (LPDDR4) memory device or Low Power DDR 5 (LPDDR5) memory device.

3. The apparatus of claim 1, wherein the at least one non-DDR memory device contains proprietary information.

4. The apparatus of claim 1, further comprising at least one fuse configured to enable or disable access to the first memory TAP.

5. The apparatus of claim 1, wherein the at least one DDR memory device and the at least one non-DDR memory device are included in a same memory package.

6. The apparatus of claim 1, further comprising a host incorporating the first memory TAP, the second memory TAP, and the test controller.

7. The apparatus of claim 6, further comprising:
 a communicative coupling configured to communicate signals for testing from the test controller to the at least one DDR memory device via the first memory TAP or the at least one non-DDR memory device via the second memory TAP.

8. The apparatus of claim 7, further comprising one of a mobile phone or a mobile communicating device incorporating the host, the at least one DDR memory device, the at least one non-DDR memory device, and the communicative coupling.

9. A method for testing a memory device, comprising:
 enabling or disabling access to at least one double data rate (DDR) memory device via a first memory test access port (TAP);
 enabling or disabling access to at least one non-DDR memory device via a second memory TAP; and
 testing, via a test controller, the at least one DDR memory device via the first memory TAP or the at least one non-DDR memory device via the second memory TAP,
 wherein access to the at least one non-DDR memory device via the second memory TAP is disabled when access to the at least one DDR memory device via the first memory TAP is enabled.

10. The method of claim 9, wherein the at least one DDR memory device is at least one Low Power DDR 4 (LPDDR4) memory device or Low Power DDR 5 (LPDDR5) memory device.

11. The method of claim 9, wherein the at least one non-DDR memory device contains proprietary information.

12. The method of claim 9, further comprising enabling or disabling access to the first memory TAP via at least one fuse.

13. The method of claim 9, wherein the at least one DDR memory device and the at least one non-DDR memory device are included in a same memory package.

14. An apparatus for testing a memory device, comprising:
 first access means for enabling or disabling access to at least one double data rate (DDR) memory device;
 second access means for enabling or disabling access to at least one non-DDR memory device; and
 test controlling means for testing the at least one DDR memory device via the first access means or the at least one non-DDR memory device via the second access means.

15. The apparatus of claim 14, wherein the at least one DDR memory device is at least one Low Power DDR 4 (LPDDR4) memory device or Low Power DDR 5 (LPDDR5) memory device.

16. The apparatus of claim 14, wherein the at least one non-DDR memory device contains proprietary information.

17. The apparatus of claim 14, further comprising third access means for enabling or disabling access to the first access means.

18. The apparatus of claim 14, wherein access to the at least one non-DDR memory device via the second access means is disabled when access to the at least one DDR memory device via the first access means is enabled.

19. The apparatus of claim 14, wherein the at least one DDR memory device and the at least one non-DDR memory device are included in a same memory package.

20. A non-transitory computer-readable medium storing computer-executable code, comprising code for causing a computer to:
 enable or disable access to at least one double data rate (DDR) memory device via a first memory test access port (TAP);
 enable or disable access to at least one non-DDR memory device via a second memory TAP; and
 test, via a test controller, the at least one DDR memory device via the first memory TAP or the at least one non-DDR memory device via the second memory TAP,
 wherein access to the at least one non-DDR memory device via the second memory TAP is disabled when access to the at least one DDR memory device via the first memory TAP is enabled.

21. The non-transitory computer-readable medium of claim 20, wherein the at least one DDR memory device is at least one Low Power DDR 4 (LPDDR4) memory device or Low Power DDR 5 (LPDDR5) memory device.

22. The non-transitory computer-readable medium of claim 20, wherein the at least one non-DDR memory device contains proprietary information.

23. The non-transitory computer-readable medium of claim 20, further comprising code for causing the computer to enable or disable access to the first memory TAP via at least one fuse.

24. The non-transitory computer-readable medium of claim 20, wherein the at least one DDR memory device and the at least one non-DDR memory device are included in a same memory package.

* * * * *